United States Patent [19]

Aoai et al.

[11] Patent Number: 4,741,985

[45] Date of Patent: May 3, 1988

[54] LIGHT-SENSITIVE COMPOSITION COMPRISING A DIAZONIUM SALT CONDENSATE AND A MODIFIED POLYVINYL ACETAL POLYMER.

[75] Inventors: Toshiaki Aoai; Kazuo Maemoto; Akihiko Kamiya, all of Kanagawa; Toshiyuki Sekiya, Shizuoka, all of Japan

[73] Assignee: Fuji Photo Film Co., Ltd., Kanagawa, Japan

[21] Appl. No.: 871,343

[22] Filed: Jun. 6, 1986

[30] Foreign Application Priority Data

Jun. 7, 1985 [JP] Japan .................................. 60-123863
Sep. 9, 1985 [JP] Japan .................................. 60-198742

[51] Int. Cl.[4] ............................................. G03C 1/52
[52] U.S. Cl. ..................................... 430/175; 430/176
[58] Field of Search ............................... 430/175, 176

[56] References Cited

U.S. PATENT DOCUMENTS

| | | | |
|---|---|---|---|
| 3,396,019 | 8/1968 | Uhlig | 430/175 |
| 4,123,276 | 10/1978 | Kita et al. | 430/175 |
| 4,467,027 | 8/1984 | Yamamoto et al. | 430/176 |
| 4,631,245 | 12/1986 | Pawlowski | 430/175 |

Primary Examiner—Paul R. Michl
Assistant Examiner—Terri Stevenson
Attorney, Agent, or Firm—Sughrue, Mion, Zinn, Macpeak, and Seas

[57] ABSTRACT

A light-sensitive composition comprising a diazonium compound and a polymer having the recurring units represented by the following general formula (I):

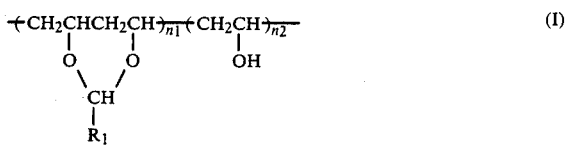

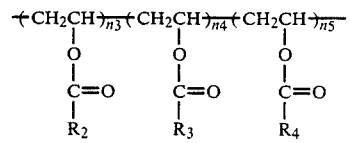

wherein $R_1$ represents a hydrogen atom or a substituted or unsubstituted alkyl group; $R_2$ represents an unsubstituted alkyl group; $R_3$ represents an aliphatic or aromatic hydrocarbon group having a carboxyl group; $R_4$ represents an aliphatic or aromatic hydrocarbon group which has at least one hydroxyl or nitrile group and which may be further substituted; $n_1$, $n_2$, $n_3$, $n_4$ and $n_5$ represent the molar percents of the respective recurring units, provided that $n_1$ is from about 5 to about 85 mol %, $n_2$ is from 0 to about 60 mol %, $n_3$ is from 0 to about 20 mol %, $n_4$ is from about 3 to about 60 mol % and $n_5$ is from greater than 0 to about 60 mol %.

21 Claims, No Drawings

4,741,985

LIGHT-SENSITIVE COMPOSITION COMPRISING A DIAZONIUM SALT CONDENSATE AND A MODIFIED POLYVINYL ACETAL POLYMER.

FIELD OF THE INVENTION

The present invention relates to a light-sensitive composition. More particularly, the present invention relates to a light-sensitive composition that is capable of efficient cross-linking upon exposure to light, which can be developed with an aqueous alkali developer, and which is suitable for use in the making of a presensitized plate from which a lithographic printing plate having an increased press life can be prepared.

BACKGROUND OF THE INVENTION

Diazonium compounds are widely used as sensitizers in presensitized printing materials, and the most commonly employed diazonium compounds are diazo resins, typically the condensation products of p-diazodiphenylamine and formaldehyde. In preparing a light-sensitive layer for use in a presensitized lithographic printing plate, the diazo resin may be used either alone as shown in U.S. Pat. No. 2,714,066 (i.e., in the absence of any binder) or in admixture with a binder as described in Japanese Patent Application (OPI) No. 30604/1975 (the term "OPI" as used herein means an unexamined published Japanese patent application) corresponding to U.S. Pat. 4,275,138. In most of the diazo-sensitized lithographic printing plates manufactured today, a diazonium compound is used together with a polymer binder in order to provide for more increased press life.

Light-sensitive layers which comprise a diazonium compound and a polymer binder may be divided into two types, depending on the type of developer used to remove (i.e., develop) the layer in unexposed areas: (1) the "alkali" developable type of light-sensitive layer which is treated with an aqueous alkali developer, and (2) the "solvent" developable type of light-sensitive layer which is treated with an organic solvent-based developer. The alkali-developer type is increasingly used today, principally for safety and environmental reasons due to problems relating to disposal of the fatigued developer. How well this type of light-sensitive layer performs is determined by the properties of the binder used. The binder may be rendered alkali-devlopable either by copolymerizing it with a carboxylic acid-containing monomer as described in Japanese Patent Application (OPI) No. 30604/1975, or by reacting the hydroxyl group in polyvinyl alcohol with a cyclic acid anhydride such as phthalic anhydride in order to introduce the carboxylic acid group into the polymer as shown in U.S. Pat. No. 2,861,058. Whichever method is used, the resulting polymer has only a low level of abrasion resistance because of its structure, and the presensitized plate using this type of carboxylic acid-containing polymer as a binder in the light-sensitive layer provides a lithographic printing plate having a short press life. When polyvinyl acetal is used as the binder, a sturdy film is formed having high abrasion resistance; however, the lithographic printing plate sensitized by a layer containing polyvinyl acetal as the binder is of the organic solvent-developable type described above and cannot be treated with aqueous alkali developers.

It has been proposed that the abrasion-resistant polyvinyl acetal is modified to make the compound alkali-soluble, and that the so-modified polyvinyl acetal is mixed with a diazonium compound. Light-sensitive compositions prepared by this method are described in British Pat. Nos. 1,370,316 and 1,600,871 and U.S. Pat. No. 3,847,614. The binder in the light-sensitive composition described in British Pat. No. 1,370,316 contains an arylsulfonyl urethane which is prepared from a sulfonyl isocyanate but this compound has the drawback that it is very difficult to synthesize the sulfonyl isocyanate industrially at economically feasible costs. The method described in U.S. Pat. No. 3,847,614 consists of copolymerizing vinyl acetate with a monomer containing a carboxylic acid and subsequently treating the copolymer such that it is saponified and converted to the acetal form. However, this method has the disadvantage that the saponified copolymer is not converted into the acetal form in a sufficient amount, causing unsatisfactory abrasion resistance of the light-sensitive composition. The light-sensitive composition described in British Pat. No. 1,600,871 suffers from the low sensitivity of diazosulfonate.

SUMMARY OF THE INVENTION

The present invention has been accomplished with a view toward solving the aforementioned problems of these prior art techniques discussed above.

One object, therefore, of the present invention, is to provide a light-sensitive composition comprising a diazonium compound and a binder and which is capable of efficient cross-linking upon exposure to light, can be developed with an aqueous alkali solution, and which has a longer press life.

Another object of the present invention is to provide a light-sensitive composition comprising a diazonium compound and a binder which is particularly suitable for use in the manufacture of presensitized lithographic printing plates.

These objects of the present invention can be attained by a light-sensitive composition comprising a diazonium compound and a polymer having the recurring units represented by the following general formula (I):

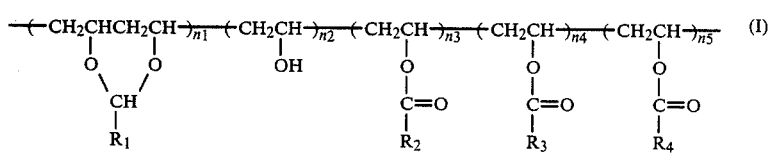

wherein $R_1$ represents a hydrogen atom or a substituted or unsubstituted alkyl group; $R_2$ represents an unsubstituted alkyl group; $R_3$ represents an aliphatic or aromatic hydrocarbon group having a carboxyl group; $R_4$ represents an aliphatic or aromatic hydrocarbon group which has at least one hydroxyl or nitrile group and which may be further substituted; $n_1$, $n_2$, $n_3$, $n_4$ and $n_5$ represent the molar percents of the respective recurring units, provided that $n_1$ is from about 5 to about 85 mol %, $n_2$ is from 0 to about 60 mol %, $n_3$ is from 0 to about 20 mol %, $n_4$ is from about 3 to about 60 mol % and $n_5$ is from greater than 0 to about 60 mol %.

DETAILED DESCRIPTION OF THE INVENTION

Examples of the diazonium compound that may be used in the present invention are described in U.S. Pat. Nos. 3,867,147 and 2,632,703. Particularly useful diazo resins are those which are the condensation products of aromatic diazonium salts and active carbonyl-containing compounds such as formaldehyde. Preferred diazo resins include hexafluorophosphates, tetrafluoroborates and phosphates of the condensation product of p-diazodiphenylamine and formaldehyde or acetaldehyde. Also preferred are sulfonates (e.g., p-toluenesulfonate and 2-methoxy-4-hydroxy-5-benzoylbenzenesulfonate), phosphinates (e.g., benzenephosphinate), hydroxy-containing compound salts (e.g., 2,4-dihydroxybenzophenone salts) and organic carboxylic acid salts of the condensation product of p-diazodiphenylamine and formaldehyde.

As described in Japanese Patent Application (OPI) No. 27141/1983, 3-methoxy-4-diazo-diphenylamine may be condensed with 4,4-bis-methoxymethyl-diphenylether and the resulting condensate may be converted to a mesitylene sulfonic acid salt.

The binder to be used in the present invention which has the recurring units represented by the general formula (I) may be prepared by the following procedures: (1) polyvinyl alcohol is converted to the acetal form by treatment with an aldehyde; (2) the remaining —OH is reacted with an acid anhydride; and, (3) part of the resulting carboxylic acid compound is reacted with a halogen-substituted compound containing a hydroxyl or cyano group. If required, the remaining —OH after the above step (1) may be reacted with an acid anhydride

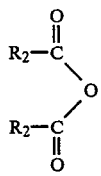

($R_2$ has the same meaning as $R_2$ defined in the formula (I)).

The polymer binder used in the present invention comprises the five recurring monomer units represented by the general formula (I). The first component, having $n_1$ designating its molar percent, is a vinyl acetal monomer unit: the second component, having $n_2$ designating its molar percent is a vinyl alcohol monomer unit; the third component, having $n_3$ designating its molar percent is an unsubstituted ester monomer unit: the fourth component, having $n_4$ designating its molar percent is an ester monomer unit having a carboxyl group; and the fifth component, having $n_5$ designating its molar percent, is an ester bond-containing monomer unit having a hydroxyl or cyano group. Each of these components may have one or more constituent units.

The first vinyl acetal monomer unit is formed by reacting a vinyl alcohol unit with an aliphatic aldehyde which may be substituted by, e.g., a carboxyl group, a hydroxy group, a chlorine atom, a bromine atom, a tertiary amino group, an alkoxyl group, a cyano group, a nitro group, an amido group, an ester group, a urethane group or an ureido group. Illustrative aliphatic aldehydes include formaldehyde, acetaldehyde, propionaldehyde, butylaldehyde, pentylaldehyde, hexylaldehyde, glyoxylic acid, N,N-dimethylformamido-di-n-butylacetal, bromoacetaldehyde, chloroacetaldehyde, 3-hydroxy-n-butylaldehyde, 3-methoxy-n-butylaldehyde, 3-(dimethylamino)-2,2-dimethylpropionaldehyde and cyanoacetaldehyde. It should, however, be understood that these are not exclusive examples of the aliphatic aldehyde serving as a reactant for the formation of the first vinyl acetal monomer unit.

Substituent $R_2$ in the third monomer unit is an unsubstituted alkyl group having from 1 to 10 carbon atoms, and a methyl or ethyl group is particularly preferred from the viewpoint of developability.

The substituent $R_3$ in the fourth monomer unit is an aliphatic or aromatic hydrocarbon group substituted by a carboxyl group and having from 1 to 20 carbon atoms. This monomer unit is formed by reacting an acid anhydride with the residual —OH group in polyvinyl acetal. Typical examples of the acid anhydride are succinic anhydride, maleic anhydride, phthalic anhydride, trimellitic anhydride and cis-4-cyclohexene-1,2-dicarboxylic anhydride, but other cyclic acid anhydrides may be employed.

It should be noted that $R_3$ may be further substituted in addition to the carboxyl group, and examples of such additional substituents include:

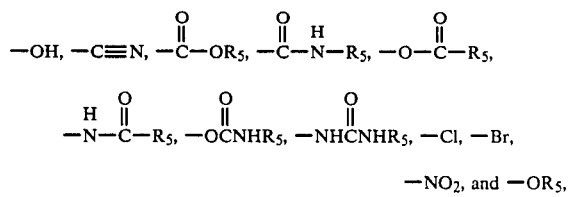

wherein $R_3$ represents, for example, a substituted or unsubstituted alkyl group, aralkyl group or aryl group having from 1 to 20 carbon atoms. Illustrative substituents when $R_5$ is substituted are —OH, —C≡N, —Cl, —Br and —NO$_2$.

Substituent $R_4$ in the fifth monomer unit is an aliphatic or aromatic hydrocarbon group substituted by a hydroxyl or cyano group and occasionally by other substituents and may be obtained by esterifying the carboxylic acid in $R_3$ in the fourth monomer unit with a halogen-substituted compound further substituted with a hydroxyl or cyano group. Illustrative but by no means limiting examples of $R_4$ are listed below:

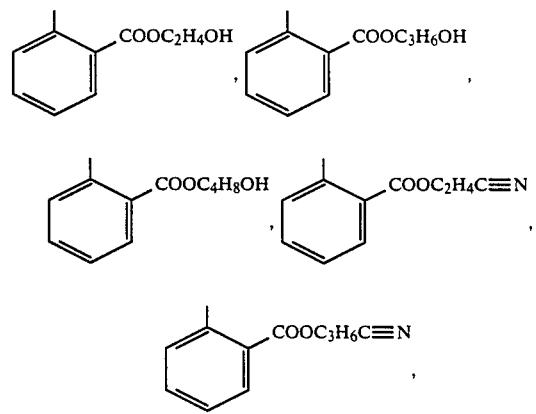

-continued
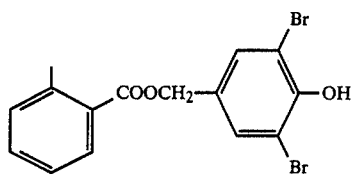
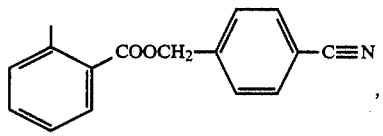
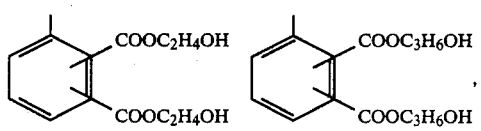
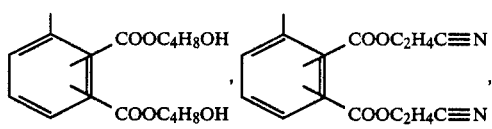
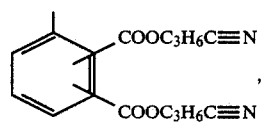
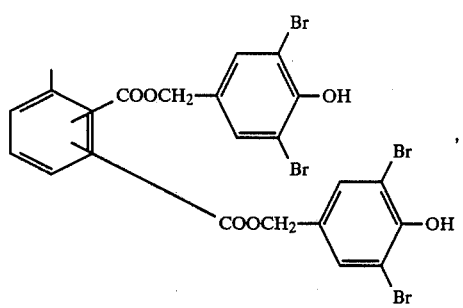
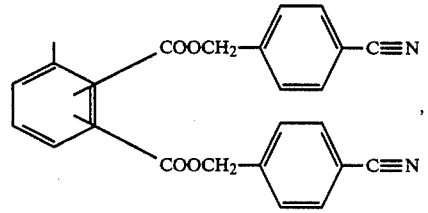
C₂H₄COOC₂H₄OH, C₂H₄COOC₃H₆OH,
C₂H₄COOC₄H₈OH, C₂H₄COOC₂H₄C≡N,
C₂H₄COOC₃H₆C≡N,
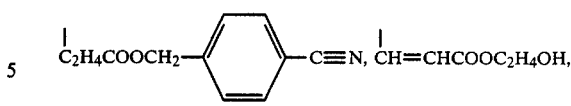
-continued
C₂H₄COOCH₂— ⌬ —C≡N, CH=CHCOOC₂H₄OH,
CH=CHCOOC₃H₆OH, CH=CHCOOC₄H₈OH,
CH=CHCOOC₂H₄C≡N, CH=CHCOOC₃H₆C≡N,
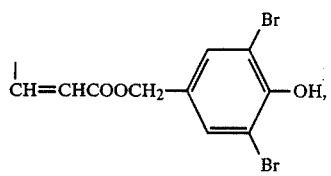
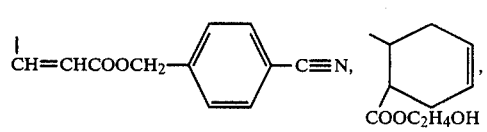
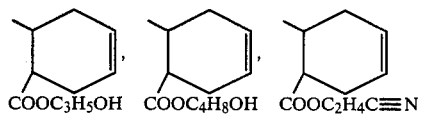
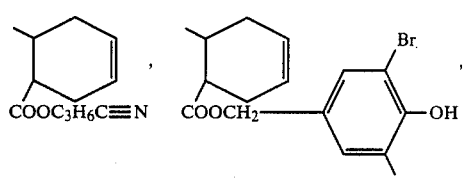
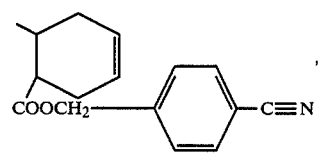
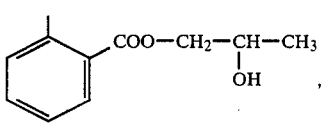
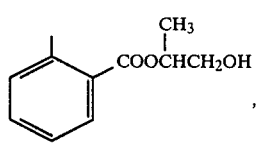
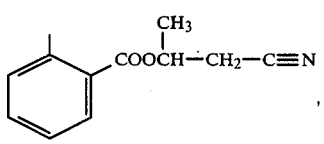

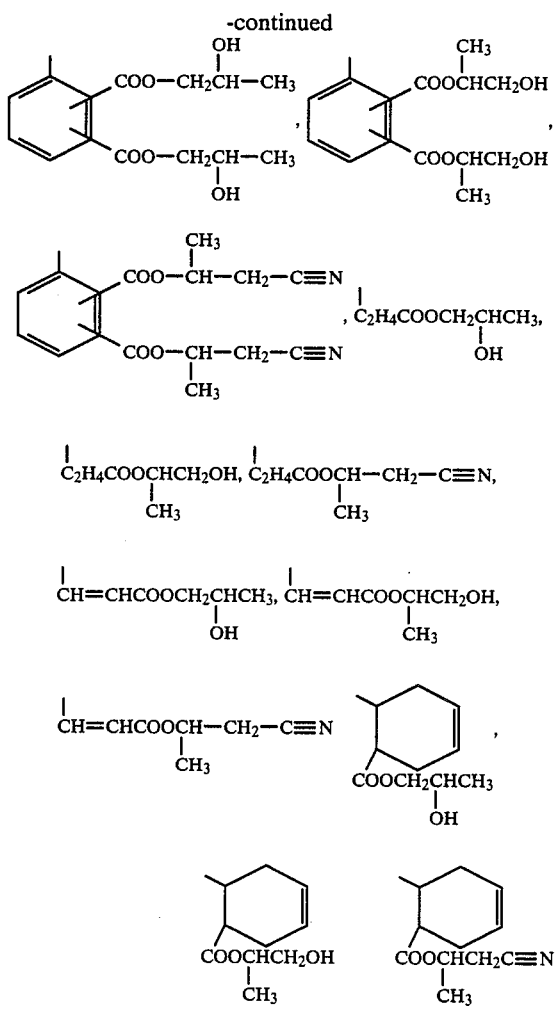

The range of $n_1$ in the general formula (I) is from about 5 to about 85 mol%, preferably 25–70 mol%. The film strength undesirably decreases by decreasing the value of $n_1$ below about 5 mol%. Increasing the value of $n_1$ above about 85 mol% is also undesirable since this leads to a decrease in the proportion of the other components.

The range of $n_2$ is from 0 to 60 mol%, preferably 0 to 30 mol%. The range of $n_3$ is from 0 to about 20 mol%, preferably 0 to 15 mol%.

The range of $n_4$ is from about 3 to about 60 mol%, preferably 10–55 mol%. Increasing the value of $n_4$ above about 60 mol% causes excessive swelling in exposed areas upon contact with an alkali developer. On the other hand, decreasing the value of $n_4$ below about 3 mol% causes difficulty in development with an alkali developer.

The range of $n_5$ is such that it is greater than 0 mol% and is not greater than about 60 mol%. Preferably, $n_5$ is within the range of 3–40 mol%. Decreasing the value of $n_5$ leads to a lower degree of cross-linking and a greater tendency of the exposed areas to swell. Increasing the value of $n_5$ above about 60 mol% is also undesirable since this leads to a decrease in the proportion of the other components.

The appropriate range of the molecular weight of the binder is from about $5 \times 10^3$ to about $4 \times 10^5$ as measured by gel permeation chromatography, and a preferred range is from $5 \times 10^4$ to $3 \times 10^5$.

The high molecular weight polymer binders described above may be used either alone or in admixture. The light-sensitive composition of the present invention contains these high molecular weight compounds in amounts ranging from about 50 to about 99.5 wt%, preferably from 55 to 95 wt%.

The light-sensitive composition of the present invention contains the high molecular weight polymer and the diazonium compound in any ratio thereof. Preferably, the diazonium compound is contained in an amount of 0.5 to 50 wt% of the light-sensitive composition, and in an amount of 1 to 50 wt%, more preferably 5 to 30 wt% of the total amount of the diazonium compound and the high molecular weight polymer.

The light-sensitive composition of the present invention may also contain other resins in amounts not exceeding about 50 wt% of the above-described polymers. Examples of resins which may also be present include miscible resins which contain a hydroxyl group, an amido group or urethane group; more illustrative examples are polyamide, epoxy, polyurethane and acrylic resins. Some improvement in adhesion may be attained by incorporating these additional resins.

The performance of the light-sensitive composition of the present invention may be further improved by adding dyes, pigments, stabilizers, fillers, surfactants and plasticizers. Advantageous dyes are oil-soluble dyes such as C.I. 26105 (Oil Red RR), C.I. 21260 (Oil Scarlet #308), C.I. 74350 (Oil Blue), C.I. 52015 (Methylene Blue), C.I. 42555 (Crystal Violet), and C.I. 42595 (Victoria Pure Blue).

Examples of stabilizers which may be used include phosphoric acid, phosphorous acid, oxalic acid, p-toluenesulfonic acid, dipicolinic acid, malic acid, tartaric acid, and 2-methoxy-4-hydroxy-5-benzoyl-benzenesulfonic acid.

The light-senstive composition of the present invention is usually dissolved in a solvent before it is coated onto a suitable support. The coated composition is then dried prior to being available for use. The composition is coated on the support in an amount from about 0.1 to about 5 g/m², preferably from 0.3 to 3 g/m², the coating weight being calculated on a dry basis.

Suitable solvents include methanol, ethanol, isopropanol, n-butanol, t-butanol, 2-methoxyethanol, 2-ethoxyethanol, 2-methoxyethyl acetate, ethylene glycol, tetrahydrofuran, dioxane, dimethyl sulfoxide, N,N-dimethylformamide, acetone, methyl ethyl ketone, and mixtures thereof.

Examples of the support on which the light-sensitive composition of the present invention may be coated include: paper, paper laminated with plastics (e.g., polyethylene, polypropylene and polystyrene), plates formed from metals such as aluminum, (including aluminum alloys), zinc and copper; films of various plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal; as well as paper or plastic films laminated or vapor-deposited with the above-mentioned metals. Aluminum plates are particularly preferred because of their extremely good dimensional stability and low cost. Also preferred are composite sheets wherein an aluminum sheet is bonded to a polyethylene terephthalate film as described in Japanese Patent Publication No. 18327/1973.

Supports having metallic surfaces, particularly those having an aluminum surface, are preferably subjected to an appropriate surface treatment such as graining, immersion in an aqueous solution of sodium silicate, potassium fluorozirconate or phosphate salt, or anodization. Aluminum plates which are suitable for use as supports are described, for example, in the following references: U.S. Pat. No. 2,714,066, wherein the aluminum plate is immersed in an aqueous solution of sodium silicate; Japanese Patent Publication No. 5125/1972, wherein the aluminum plate is anodized and then immersed in an aqueous solution of an alkali metal salt of silicic acid; and U.S. Pat. No. 4,476,006, wherein the aluminum plate is surface-treated by the combination of mechanical and electrolytic roughening techniques. Anodization is performed by passing an electric current through an electrolyte solution in which the anode (i.e., an aluminum plate) is immersed. The electrolyte solution comprises one or more aqueous or nonaqueous solutions of an inorganic acid (e.g. phosphoric acid, chromic acid, sulfuric acid or boric acid), or an organic acid (e.g., oxalic acid or sulfamic acid) or salts thereof.

It is also preferred to seal the tiny holes that may be left on the support after graining or anodization. Such sealing treatments may be carried out by immersing the aluminum plate in an aqueous solution of sodium silicate, boiling water or a boiling aqueous solution containing an inorganic or organic salt. Alternatively, the plate may be treated in a steam bath to effect sealing.

Another effective surface treatment is electrodeposition using a silicate as described in U.S. Pat. No. 3,658,662.

The light-sensitive composition coated onto a support is processed by the following procedures. First, it is exposed through a transparent original having a line image, halftone image or any other appropriate image, and is subsequently developed with an aqueous alkali developer to provide a relief image which is negative relative to the original image.

Illustrative light sources that may be used in the exposure step include a carbon arc lamp, a mercury lamp, a xenon lamp, a tungsten lamp and a metal halide lamp.

The light-sensitive composition of the present invention has a high degree of solubility in organic solvents which are used to prepare coating solutions for application to the support. The composition is also capable of being developed to a high degree with an alkali developer which is used to remove unexposed areas after imagewise exposure following the coating and drying steps. The relief image formed by such development exhibits high abrasion resistance, good ink receptivity and strong adhesion to the support. Because of these features, a lithographic printing plate using the light-sensitive composition of the present invention is consistent in its running characteristics and is capable of producing an increased number of copies of excellent quality.

The following synthesis examples and working examples are included for the purpose of further illustrating the present invention but are not intended to limit the scope of the invention in any manner. In the examples, all percents are by weight.

SYNTHESIS EXAMPLE 1

A three-necked round-bottom flask (capacity: 1,000 ml) equipped with a thermometer, a reflux condenser and a stirrer was charged with 60 g of polyvinyl butyral (Denka Butyral #4000-2, manufactured by Denki Kagaku Kogyo K.K.) in 720 ml of acetic acid. The mixture was heated to form a solution. After raising the temperature in the flask to 100° C., 89.8 g of phthalic anhydride and 60.5 g of sodium acetate were added and the resulting mixture was allowed to react for 3 hours. Thereafter, this reaction mixture was added to 10 liters of a solution of methanol and water (1:3) in small portions in order to form a solid precipitate. This precipitate was vacuum-dried to obtain polymer (A) in an amount of 64.8 g. The acid content of the polymer was 2.72 meq/g.

SYNTHESIS EXAMPLE 2

An apparatus of the same type as used in Synthesis Example 1 was charged with 60 g of polyvinyl propional (52mol% propional unit and 48 mol% vinyl alcohol unit) which was dissolved in 720 ml of acetic acid by heating. After raising the temperature in the apparatus to 100° C., 230 g of phthalic anhydride and 60.5 g of sodium acetate were added and the resulting mixture was allowed to react for 3 hours. Thereafter, the reaction mixture was precipitated as in Synthesis Example 1 to obtain 61.5 g of polymer (B) with an acid content of 2.82 meq/g.

SYNTHESIS EXAMPLE 3

An apparatus of the same type as used in Synthesis Example 1 was charged with 60 g of polyvinyl formal (Vinylec B-2 manufactured by Chisso Corporation) which was dissolved in 720 ml of acetic acid. After raising the temperature in the apparatus to 100° C., 132.8 g of trimellitic anhydride and 72.0 g of sodium acetate were added and the resulting mixture was allowed to react for 4 hours. Thereafter, this reaction mixture was precipitated as in Synthesis Example 1 to obtain 60.8 g of polymer (C) with an acid content of 2.82 meq/g.

SYNTHESIS EXAMPLE 4

A three-necked round-bottom flask (capacity: 1000 ml) equipped with a thermometer, a reflux condenser and a stirrer was charged with 45 g of the modified polyvinyl butyral (A) prepared in Synthesis Example 1. The polymer was dissolved in 450 ml of N,N-dimethylformamide by heating. After raising the temperature in the flask to 80° C., 6.91 g of potassium carbonate and 6.24 g of ethylene bromohydrin were added and the resulting mixture was allowed to react for 3 hours. Thereafter, this reaction mixture was added to 5,000 ml of a solution of water and acetic acid (19:1) in small portions in order to form a solid precipitate. The solid matter was vacuum-dried to obtain polymer (D) in an amount of 38.4 g. The acid content of the polymer was 1.48 meq/g.

SYNTHESIS EXAMPLE 5

The procedures of Synthesis Example 4 were repeated except that 6.93 g of propylene bromohydrin was added dropwise instead of ethylene bromohydrin. The reaction mixture was precipitated as in Synthesis Example 4 to obtain 39.8 g of polymer (E) with an acid content of 1.37 meq/g.

SYNTHESIS EXAMPLE 6

The procedures of Synthesis Example 4 were repeated except that 6.69 g of 3-bromopropionitrile was added dropwise instead of ethylene bromohydrin. The reaction mixture was precipitated as in Synthesis Example 4 to obtain 37.5 g of polymer (F) with an acid content of 1.48 meq/g.

SYNTHESIS EXAMPLE 7

The procedures of Synthesis Example 4 were repeated except that 17.2 g of 3,5-dibromo-4-hydroxybenzyl bromide was added instead of ethylene bromohydrin. The reaction mixture was precipitated as in Synthesis Example 4 to obtain 40.8 g of polymer (G) was an acid content of 1.75 meq/g.

SYNTHESIS EXAMPLE 8

The procedures of Synthesis Example 4 were repeated except that 3.12 g of ethylene bromohydrin and 3.35 g of 3-bromopropionitrile were added dropwise instead of ethylene bromohydrin. The reaction mixture was precipitated as in Synthesis Example 4 to obtain 40.5 g of polymer (H) with an acid content of 1.48 meq/g.

SYNTHESIS EXAMPLE 9

An apparatus of the same type as used in Synthesis Example 4 was charged with 45 g of the modified polyvinyl propional (B) prepared in Synthesis Example 2. The polymer was dissolved in 450 ml of N,N-dimethylformamide by heating. After raising the temperature in the apparatus to 80° C., 7.3 g of potassium carbonate and 6.55 g of ethylene bromohydrin were added and the resulting mixture was allowed to react for 3 hours. Thereafter, the reaction mixture was added to 10 liters of a solution of water and acetic acid (19:1) in small portions in order to form a solid precipitate. The solid precipitate was vacuum-dried to obtain polymer (I) in an amount of 41.8 g. The acid content of the polymer was 1.27 meq/g.

SYNTHESIS EXAMPLE 10

An apparatus of the same type as used in Synthesis Example 4 was charged with 45 g of the modified polyvinyl formal (C) prepared in Synthesis Example 3. The polymer was dissolved in 450 ml of N,N-dimethylformamide by heating. After raising the temperature in the apparatus of 80° C., 15.4 g of potassium carbonate and 14.0 g of ethylene bromohydrin were added and the resulting mixture was allowed to react for 3 hours. Thereafter, this reaction mixture was added to 10 liters of a solution of water and acetic acid (19:1) in small portions in order to form a solid precipitate. The solid precipitate was vacuum-dried to obtain polymer (J) in an amount of 39.4 g. The acid content of the polymer was 1.20 meq/g.

SYNTHESIS EXAMPLE 11

A three-necked round-bottom flask (capacity: 1,000 ml) equipped with a thermometer, a reflux condenser and a stirrer was charged with 45 g of the modified polyvinyl butyral (A) prepared in Synthesis Example 1. The polymer was dissolved in 450 ml of N,N-dimethylformamide by heating. After raising the temperature in the flask to 80° C., 0.79 g of potassium carbonate and 0.70 g of ethylene bromohydrin were added and the resulting mixture was allowed to react for 3 hours. Thereafter, the reaction mixture was added to 5,000 ml of a solution of water and acetic acid (19:1) in small portions in order to form a solid precipitate. The solid precipitate was vacuum-dried dried to obtain polymer (K) in an amount of 38.4 g. The acid content of the polymer was 2.57 meq/g.

SYNTHESIS EXAMPLE 12

The procedures of Sythesis Example 11 were repeated except that 0.79 g of propylene bromohydrin was added dropwise instead of ethylene bromohydrin. The reaction mixture was precipitated as in Synthesis Example 11 to obtain 39.8 g. of polymer (L) with an acid content of 2.59 meq/g.

SYNTHESIS EXAMPLE 13

The procedures of Synthesis Example 11 were repeated except that 0.76 g of 3-bromopropionitrile was added dropwise instead of ethylene bromohydrin. The reaction mixture was precipitated as in Synthesis Example 11 to obtain 37.5 g of polymer (M) with an acid content of 2.56 meq/g.

Synthesis Example 14

The procedures of Synthesis Example 11 were repeated except that 1.96 g of 3,5-dibromo-4-hydroxybenzyl bromide was added dropwise instead of ethylene bromohydrin. The reaction mixture was precipitated as in Synthesis Example 11 to obtain 40.8 g of polymer (N) with an acid content of 2.63 meq/g.

EXAMPLES 1 TO 11 AND COMPARATIVE EXAMPLE 1

Aluminum plates 0.24 mm thick were grained with a nylon brush and an aqueous suspension of pumice powder (400 mesh). After thorough washing with water, the plates were etched by immersion in a 10% aqueous solution of sodium hydroxide for 60 seconds at 70° C. The etched plates were washed under flushing water, neutralized with 20% nitric acid and washed again. The plates were then roughened by the electrochemical method described in Japanese Patent Application (OPI) No. 67507/1978 (wherein an alternating sine-wave current ($V_A$, 12.7 volts; $V_C$, 9.1 volts) was applied to a 1% aqueous solution of nitric acid such that the quantity of electricity at the anode time was 160 coulombs/dm$^2$). The plates were then desmutted by immersion in a 30% aqueous solution of sulfuric acid for 2 minutes at 55° C. Thereafter, the plates were anodized in a 7% aqueous solution of sulfuric acid to provide an anodic film with a thickness of 2.0 g/m$^2$. The anodized plates were immersed in a 3% aqueous solution of sodium silicate for 1 minute at 70° C., and subsequently washed with water and dried. The thus prepared aluminum plates were coated with sensitizing solutions having the formulation indicated below, and then dried by heating at 80° C. for 2 minutes. The coating weight of each sensitizer layer was 2.0 g/m$^2$ on a dry basis.

| Sensitizer Solution | |
| --- | --- |
| Components | Amounts |
| 2-Methoxy-4-hydroxy-5-benzoylbenzene-sulfonate of the condensation product of 4-diazodiphenylamine and formaldehyde | 0.5 g |
| One of the polymers (A) and (D) to (N) prepared in Synthesis Examples 1 and 4 to 14 | 5.0 g |
| Oil-soluble dye (Victoria Pure Blue BOH) | 0.1 g |
| Phosphorous acid | 0.05 g |

-continued

| Sensitizer Solution | |
|---|---|
| Components | Amounts |
| 2-Methoxyethanol | 100.00 g |

The thus presensitized plates were imagewise exposed for 1 minute under 2 KW metal halide lamp placed at a distance of 1 m. Thereafter, the plates were immersed in a developing solution (for its formulation, see below) for 1 minute at room temperature. The surfaces of the plates were rubbed lightly with a cotton swab to remove the unexposed areas, thereby producing lithographic printing plates (I) to (XII) carrying a light blue image.

| Developing Solution | |
|---|---|
| Components | Amounts |
| Sodium sulfite | 5 g |
| Benzyl alcohol | 30 g |
| Sodium carbonate | 5 g |
| Sodium Isopropylnaphthalenesulfonate | 12 g |
| Water | 1,000 g |

Each of the printing plates was set on a press (Model GTO of Heidelberger AG) and printing was done on high-quality paper with a commercial ink. The press life of the plates (I) to (XII) are summarized in Table 1.

TABLE 1

| Run No. | Printing Plate | Polymer | Impressions (Copies) |
|---|---|---|---|
| Comparative Example 1 | (I) | (A) | 160,000 |
| 1 | (II) | (D) | 220,000 |
| 2 | (III) | (E) | 200,000 |
| 3 | (IV) | (F) | 190,000 |
| 4 | (V) | (G) | 190,000 |
| 5 | (VI) | (H) | 230,000 |
| 6 | (VII) | (I) | 230,000 |
| 7 | (VIII) | (J) | 190,000 |
| 8 | (IX) | (K) | 230,000 |
| 9 | (X) | (L) | 200,000 |
| 10 | (XI) | (M) | 210,000 |
| 11 | (XII) | (N) | 210,000 |

The above data show that printing plates (II) to (XII) wherein polymers (D) to (N) containing the recurring unit of the fifth monomer (i.e., having mol% represented by $n_5$) in general formula (I) were used as a binder in the light-sensitive layer were unexpectedly superior in press life to printing plate (I) wherein polymer (A) which did not contain said fifth monomer unit was used as a binder.

EXAMPLES 12–22 AND COMPARATIVE EXAMPLE 2

Aluminum plates which were surface-treated as in Example 1 were coated with sensitizer solutions having the formulation indicated below, and dried at 80° C. for 2 minutes. The presensitized plates were exposed and developed as in Example 1 to prepare printing plates (XIII) to (XXIV).

| Sensitizer Solution | |
|---|---|
| Components | Amounts |
| Hexafluorophosphate of the condensation product of | 0.5 g |

-continued

| Sensitizer Solution | |
|---|---|
| Components | Amounts |
| 4-diazodiphenylamine and formaldehyde | |
| One of the polymers (A) and (D) to (N) | 5.0 g |
| Oil-soluble dye (Oil Blue #603 of Orient Chemical Industry Co., Ltd.) | 0.1 g |
| Malic acid | 0.05 g |
| 2-Methoxyethanol | 100.00 g |

Each of the printing plates was set on a press (Model GTO of Heidelberger AG) and printing was performed on high-quality paper with a commercial ink. The running characteristics of the plates (XIII) to (XXIV) are summarized in Table 2, from which it is easily seen that plates (XIV) to (XXIV) of the present invention were capable of producing many more impressions than plate (XIII) of comparative Example 2 employing a polymer binder in the light-sensitive layer which is outside the scope of the claimed polymer binders represented by general formula (I) of the present invention.

TABLE 2

| Run No. | Printing Plate | Polymer | Impressions (Copies) |
|---|---|---|---|
| Comparative Example 2 | (XIII) | (A) | 150,000 |
| Example 12 | (XIV) | (D) | 230,000 |
| Example 13 | (XV) | (E) | 190,000 |
| Example 14 | (XVI) | (F) | 200,000 |
| Example 15 | (XVII) | (G) | 180,000 |
| Example 16 | (XVIII) | (H) | 200,000 |
| Example 17 | (XIX) | (I) | 240,000 |
| Example 18 | (XX) | (J) | 170,000 |
| Example 19 | (XXI) | (K) | 230,000 |
| Example 20 | (XXII) | (L) | 220,000 |
| Example 21 | (XIIII) | (M) | 210,000 |
| Example 22 | (XXIV) | (N) | 220,000 |

While the invention has been described in detail and with reference to specific embodiments thereof, it will be apparent to one skilled in the art that various changes and modifications can be made therein without departing from the spirit and scope thereof.

What is claimed is:

1. A light-sensitive composition comprising a photosensitive diazonium salt condensate in admixture with a polymer having the recurring units represented by the following general formula (I):

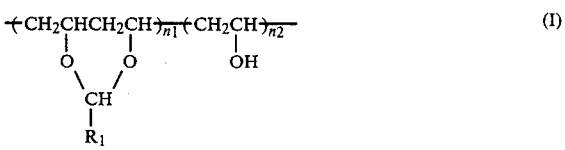

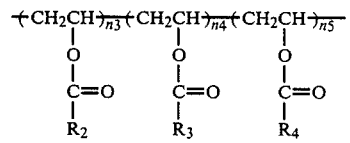

wherein $R_1$ represents a hydrogen atom, a substituted or unsubstituted alkyl group, —COOH or —N(CH$_3$)$_2$; $R_2$ represents an unsubstituted alkyl group; $R_3$ represents an aliphatic or aromatic hydrocarbon group having a carboxyl group; $R_4$ represents an aliphatic or aromatic hydrocarbon group which has at least one hydroxyl or nitrile group and which may be further substituted; $n_1$, $n_2$, $n_3$, $n_4$ and $n_5$ represent the molar percents of the respective recurring units, provided that $n_1$ is from about 5 to about 85 mol%, $n_2$ is from 0 to about 60 mol%, $n_3$ is from 0 to about 20 mol%, $n_4$ is from about 3 to about 60 mol%, $n_5$ is from greater than 0 to about 60 mol% and said photosensitive diazonium salt condensate is present in an amount sufficient to render said composition insoluble upon exposure to light.

2. A light-sensitive composition according to claim 1, wherein said photosensitive diazonium salt condensate is the condensation product of an aromatic diazonium salt and an active carbonyl-containing compound.

3. A light-sensitive composition according claim 2, wherein said active carbonyl-containing compound is formaldehyde.

4. A light-sensitive composition according to claim 1, wherein said photosensitive diazonium salt condensate is selected from the group consisting of hexofluorophosphates, tetrafluoroborates, phosphates of the condensation product of p-diazodiphenylamine and formaldehyde or acetaldehyde, sulfonates, phosphinates, hydroxy-containing compound salts and organic carboxylic acid salts of the condensation product of p-diazodiphenylamine and formaldehyde.

5. A light-sensitive composition according to claim 1, wherein $R_2$ represents an unsubstituted alkyl group having from 1 to 10 carbon atoms.

6. A light-sensitive composition according to claim 5, wherein $R_2$ is a methyl or ethyl group.

7. A light-sensitive composition according to claim 1, wherein $R_3$ is an aliphatic or aromatic hydrocarbon group substituted by a carboxyl group and having from 1 to 20 carbon atoms.

8. A light-sensitive composition according to claim 7, wherein $R_3$ may be further substituted by

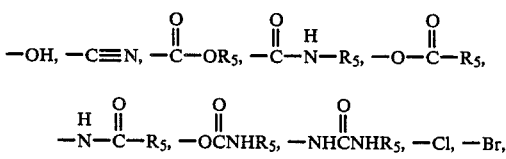

$-NO_2$, and $-OR_5$, wherein $R_5$ represents a substituted or unsubstituted alkyl group, aralkyl group or aryl group having from 1 to 20 carbon atoms.

9. A light-sensitive composition according to claim 1, wherein $R_4$ may be further substituted with one or more halogen atoms.

10. A light-sensitive composition according to claim 1, wherein $n_1$ is from 25 to 70 mol%.

11. A light-sensitive composition according to claim 1, wherein $n_2$ is from 0 to 30 mol%.

12. A light-sensitive composition according to claim 1, wherein $n_3$ is from 0 to 15 mol%.

13. A light-sensitive composition according to claim 1, wherein $n_4$ is from 10 to 55 mol%.

14. A light-sensitive composition according to claim 1, wherein $n_5$ is from 3 to 40 mol%.

15. A light-sensitive composition according to claim 1, wherein said polymer has a molecular weight from about $5 \times 10^3$ to about $4 \times 10^5$ as measured by gel permeation chromatography.

16. A light-sensitive composition according to claim 13, wherein said polymer has a molecular weight of from $5 \times 10^4$ to $3 \times 10^5$ as measured by gel permeation chromatography.

17. A light-sensitive composition according to claim 1 wherein said polymer is present in an amount from about 50 to about 99.5 wt% based on the weight of said composition.

18. A light-sensitive composition according to claim 15, wherein said polymer is present in an amount from 55 to 95 wt% based on the weight of said composition.

19. A light-sensitive composition according to claim 1, which further comprises at least one resin selected from polyamide, epoxy, polyurethane and acrylic resins, in an amount not exceeding about 50 wt% of said polymer.

20. A light-sensitive composition according to claim 1, wherein said composition is coated on a support in an amount from about 0.1 to about 5 g/m² calculated on a dry basis.

21. A light-sensitive composition according to claim 18, wherein said composition is coated on a support in an amount from 0.3 to 3 g/m² calculated on a dry basis.

* * * * *